(12) United States Patent
Hirai et al.

(10) Patent No.: US 9,340,899 B2
(45) Date of Patent: *May 17, 2016

(54) PLANAR NONPOLAR GROUP-III NITRIDE FILMS GROWN ON MISCUT SUBSTRATES

(71) Applicant: THE REGENTS OF THE UNIVERSITY OF CALIFORNIA, Oakland, CA (US)

(72) Inventors: Asako Hirai, Santa Barbara, CA (US); Zhongyuan Jia, Goleta, CA (US); Makoto Saito, Tsukuba Ibaraki (JP); Hisashi Yamada, Tsukuba Ibaraki (JP); Kenji Iso, Tsukubamirai Ibaraki (JP); Steven P. DenBaars, Goleta, CA (US); Shuji Nakamura, Santa Barbara, CA (US); James S. Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/305,734

(22) Filed: Jun. 16, 2014

(65) Prior Publication Data

US 2014/0291694 A1 Oct. 2, 2014

Related U.S. Application Data

(63) Continuation of application No. 14/164,434, filed on Jan. 27, 2014, now Pat. No. 8,791,000, which is a continuation of application No. 13/427,590, filed on Mar. 22, 2012, now Pat. No. 8,691,671, which is a
(Continued)

(51) Int. Cl.
*H01L 21/02* (2006.01)
*C30B 23/02* (2006.01)
(Continued)

(52) U.S. Cl.
CPC ............. *C30B 23/025* (2013.01); *C30B 23/066* (2013.01); *C30B 25/18* (2013.01); *C30B 25/186* (2013.01); *C30B 29/403* (2013.01); *H01L 21/0237* (2013.01); *H01L 21/0243* (2013.01);
(Continued)

(58) Field of Classification Search
CPC .................. H01L 21/02365; H01L 21/02428; H01L 21/02518
See application file for complete search history.

(56) References Cited

U.S. PATENT DOCUMENTS 6,489,636 B1 12/2002 Goetz et al.
7,208,393 B2 4/2007 Haskell et al.
(Continued)

FOREIGN PATENT DOCUMENTS

JP 2006024897 1/2006
JP 2008285364 11/2008
KR 10-2008-0101707 11/2008

OTHER PUBLICATIONS

Korean Office Action (with English Translation) dated Jun. 5, 2014 for Korean Patent Application No. 10-2009-7027548.
(Continued)

*Primary Examiner* — Cheung Lee
(74) *Attorney, Agent, or Firm* — Gates & Cooper LLP

(57) ABSTRACT

A nonpolar III-nitride film grown on a miscut angle of a substrate, in order to suppress the surface undulations, is provided. The surface morphology of the film is improved with a miscut angle towards an a-axis direction comprising a 0.15° or greater miscut angle towards the a-axis direction and a less than 30° miscut angle towards the a-axis direction.

20 Claims, 6 Drawing Sheets

Related U.S. Application Data continuation of application No. 12/140,096, filed on Jun. 16, 2008, now Pat. No. 8,158,497.

(60) Provisional application No. 60/944,206, filed on Jun. 15, 2007.

(51) Int. Cl.

| | |
|---|---|
| *C30B 25/18* | (2006.01) |
| *C30B 29/40* | (2006.01) |
| *H01L 29/04* | (2006.01) |
| *H01L 29/16* | (2006.01) |
| *H01L 29/20* | (2006.01) |
| *H01L 29/26* | (2006.01) |
| *C30B 23/06* | (2006.01) |
| *H01L 31/0304* | (2006.01) |
| *H01L 31/036* | (2006.01) |
| *H01L 31/18* | (2006.01) |
| *H01L 33/00* | (2010.01) |
| *H01L 33/16* | (2010.01) |
| *H01L 33/32* | (2010.01) |

(52) U.S. Cl.
CPC ...... *H01L 21/0254* (2013.01); *H01L 21/02389* (2013.01); *H01L 21/02433* (2013.01); *H01L 21/02529* (2013.01); *H01L 21/02565* (2013.01); *H01L 21/02609* (2013.01); *H01L 21/02617* (2013.01); *H01L 21/02636* (2013.01); *H01L 29/04* (2013.01); *H01L 29/1608* (2013.01); *H01L 29/2003* (2013.01); *H01L 29/26* (2013.01); *H01L 31/036* (2013.01); *H01L 31/03044* (2013.01); *H01L 31/1856* (2013.01); *H01L 33/0075* (2013.01); *H01L 33/16* (2013.01); *H01L 33/32* (2013.01); *Y10T 428/24612* (2015.01)

(56) References Cited

U.S. PATENT DOCUMENTS

| | | | |
|---|---|---|---|
| 2005/0208687 A1 | 9/2005 | Kasai et al. | |
| 2005/0214992 A1* | 9/2005 | Chakraborty | ..... H01L 21/02378 438/172 |
| 2005/0245095 A1 | 11/2005 | Haskell et al. | |
| 2006/0011128 A1 | 1/2006 | Ellison et al. | |
| 2007/0111488 A1 | 5/2007 | Chakraborty et al. | |
| 2008/0283851 A1 | 11/2008 | Akita | |

OTHER PUBLICATIONS

Taiwanese Office Action (with English translation) dated Mar. 14, 2014 for Taiwanese Patent Application No. 097122460.

Japanese Office Action (with English Translation) dated Jul. 8, 2013 for Japanese Patent Application No. 2010-512426.

Japanese Office Action (with English Translation) dated Dec. 26, 2012 for Japanese Patent Application No. 2010-512426.

Grudowski, P.A. et al., "The Effect of substrate misorientation on the photoluminescence properties of GaN grown on sapphire metalorganic chemical vapor deposition," App. Phys. Lett., 1996, 69(24), pp. 3626-3628.

Hess, R. et al., "Lattice tilt and relaxation in InGaP/GaAs/Ge solar cells on miscut substrates," Journal of Physics D Applied Physics, vol. 32, No. 10A, May 21, 1999, pp. A16-A20.

Hirai, A. et al., "Formation and reduction of pyramidal hillocks on m-plane {1100}GaN," Applied Physics Letters 91 (2007), pp. 191906-1-191906-3.

Hiramatsu, K. et al., "MOVPE Growth of GaN on a Misoriented Sapphire Substrate," J. Cryst. Growth, 1991, 107, pp. 509-512.

Lin, Y. et al., "Blue-green InGaN/GaN laser diodes on miscut m-plane GaN substrate," Applied Physics Express 2 (2009) 082102.

Yamada, H. et al., "Impact of substrate miscut on the characteristic of m-plane InGaN/GaN light emitting diodes," Japanese Journal of Applied Physics, part 2 (letters), Japan Society of Applied Physics, vol. 46, Nos. 45-49, Nov. 22, 2007, pp. L1117-L1119.

Zauner, A. et al., "Homoepitaxial growth on misoriented GaN substrates by MOCVD," Materials Research Society Symposium Proceedings, Materials Research Society, Jan. 1, 2000, pp. W6.3.1-W6.3.6.

PCT International Search Report mailed on Sep. 16, 2008, International Application No. PCT/US2008/067149, Filing Date Jun. 16, 2008.

Taiwanese Office Action (with English Translation) dated Oct. 22, 2015 for Taiwanese Patent Application No. 103138109.

\* cited by examiner

PLANAR NONPOLAR GROUP-III NITRIDE FILMS GROWN ON MISCUT SUBSTRATES

CROSS-REFERENCE TO RELATED APPLICATIONS

This application is a continuation under 35 U.S.C. Section 120 of co-pending and commonly-assigned U.S. Utility patent application Ser. No. 14/164,434, filed on Jan. 27, 2014, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR GROUP III NITRIDE FILMS GROWN ON MISCUT SUBSTRATES" attorneys' docket number 30794.238-US-C2 (2007-674-4), which application is a continuation under 35 U.S.C. Section 120 of co-pending and commonly-assigned U.S. Utility patent application Ser. No. 13/427,590, filed on Mar. 22, 2012, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR GROUP III NITRIDE FILMS GROWN ON MISCUT SUBSTRATES", which application is a continuation under 35 U.S.C. Section 120 of co-pending and commonly-assigned U.S. Utility patent application Ser. No. 12/140,096, filed on Jun. 16, 2008, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR M-PLANE GROUP III NITRIDE FILMS GROWN ON MISCUT SUBSTRATES", now U.S. Pat. No. 8,158,497, issued Apr. 17, 2012, which application claims the benefit under 35 U.S.C. Section 119(e) of co-pending and commonly-assigned U.S. Provisional Patent Application Ser. No. 60/944,206, filed on Jun. 15, 2007, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR m-PLANE GROUP III NITRIDE FILMS GROWN ON MISCUT SUBSTRATES", all of which applications are incorporated by reference herein.

This application is related to the following co-pending and commonly-assigned U.S. patent applications:

U.S. Provisional Patent Application Ser. No. 60/954,770, filed on Aug. 8, 2007, by Hisashi Yamada, Kenji Iso, and Shuji Nakamura, entitled "NONPOLAR III-NITRIDE LIGHT EMITTING DIODES WITH LONG WAVELENGTH EMISSION,";

U.S. Provisional Patent Application Ser. No. 60/954,767, filed on Aug. 8, 2007, by Hisashi Yamada, Kenji Iso, Makoto Saito, Asako Hirai, Steven P. DenBaars, James S. Speck, and Shuji Nakamura, entitled "III-NITRIDE FILMS GROWN ON MISCUT SUBSTRATES,"; and U.S. Provisional Patent Application Ser. No. 60/954,744, filed on Aug. 8, 2007, by Kenji Iso, Hisashi Yamada, Makoto Saito, Asako Hirai, Steven P. DenBaars, James S. Speck, and Shuji Nakamura, entitled "PLANAR NONPOLAR M-PLANE GROUP III-NITRIDE FILMS GROWN ON MISCUT SUBSTRATES,";

which applications are incorporated by reference herein.

BACKGROUND OF THE INVENTION

1. Field of the Invention

The present invention relates to a technique for the growth of planar films of nonpolar m-plane, and more specifically, to a technique for the growth of an atomically smooth m-GaN film without any surface undulations.

2. Description of the Related Art

The usefulness of gallium nitride (GaN) and its ternary and quaternary compounds incorporating aluminum and indium (AlGaN, InGaN, AlInGaN) has been well established for fabrication of visible and ultraviolet optoelectronic devices and high-power electronic devices. These compounds are referred to herein as Group III nitrides, or III-nitrides, or just nitrides, or by the nomenclature (Al, B, Ga, In)N. Devices made from these compounds are typically grown epitaxially using growth techniques including molecular beam epitaxy (MBE), metalorganic chemical vapor deposition (MOCVD), and hydride vapor phase epitaxy (HVPE).

GaN and its alloys are the most stable in the hexagonal wurtzite crystal structure, in which the structure is described by two (or three) equivalent basal plane axes that are rotated 120° with respect to each other (the a-axis), all of which are perpendicular to a unique c-axis. Group III and nitrogen atoms occupy alternating c-planes along the crystal's c-axis. The symmetry elements included in the wurtzite structure dictate that III-nitrides possess a bulk spontaneous polarization along this c-axis, and the wurtzite structure exhibits piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN optoelectronic devices is to grow the devices on nonpolar planes of the crystal. Such planes contain equal numbers of Ga and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes.

The other cause of polarization is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice matching to the GaN. Therefore, for an InGaN quantum well on GaN, the piezoelectric polarization will point in the opposite direction than that of the spontaneous polarization of the InGaN and GaN. For an AlGaN layer latticed matched to GaN, the piezoelectric polarization will point in the same direction as that of the spontaneous polarization of the AlGaN and GaN.

The advantage of using nonpolar planes over c-plane nitrides is that the total polarization will be reduced. There may even be zero polarization for specific alloy compositions on specific planes. Such scenarios will be discussed in detail in future scientific papers. The important point is that the polarization will be reduced compared to that of c-plane nitride structures.

Although high performance optoelectronic devices on nonpolar m-plane GaN have been demonstrated, it is known to be difficult to obtain smooth surfaces for the m-plane non polar GaN. The m-plane GaN surface is typically covered with facets or rather macroscopic surface undulations. Surface undulation is mischievous, for example, because it would originate faceting in quantum structures, and inhomogeneous incorporation of alloy atoms or dopants depend on the crystal facets, etc.

The present invention describes a technique for the growth of planar films of nonpolar m-plane nitrides. For example, an atomically smooth m-GaN film without any surface undulations has been demonstrated using this invention.

SUMMARY OF THE INVENTION

The present invention discloses a method for growing planar nonpolar III-nitride films that have atomically smooth surfaces, without any macroscopic surface undulations, by selecting a miscut angle of a substrate upon which the nonpolar III-nitride films are grown, in order to suppress the surface undulations of the nonpolar III-nitride films. The miscut angle is an in-plane miscut angle towards the a-axis direction, wherein the miscut angle is a 0.15° or greater miscut angle towards the a-axis direction and a less than 30° miscut angle towards the a-axis direction.

The present invention discloses a nonpolar III-nitride film growth on a miscut of a substrate, wherein a top surface of the film is a nonpolar plane and the miscut is a surface of the substrate angled at a miscut angle with respect to a crystallographic plane of the substrate.

The miscut angle may be 0.15° or greater. The crystallographic plane may be an m-plane, the nonpolar III-nitride film may be m-plane, and the miscut angle may be towards an a-axis direction and comprise a 0.15° or greater miscut angle towards the a-axis direction and a less than 30° miscut angle towards the a-axis direction. The top surface may be atomically smooth or planar. The miscut angle may be such that a root mean square (RMS) step height of one or more undulations on the top surface, over a length of 1000 micrometers, is 50 nm or less. The miscut angle may be such that a maximum step height of the undulations on the top surface, over a length of 1000 micrometers is 61 nm or less. The undulations may comprise faceted pyramids.

The crystallographic plane may be a nonpolar plane. The miscut angle may be sufficiently small such that the film is nonpolar. The miscut angle may be such that the top surface, and one or more surfaces of one or more layers deposited on the top surface, are sufficiently smooth for a quantum well interface or a heterojunction interface.

The film may be a substrate or template and the top surface is suitable for subsequent growth of device-quality (Al, B, Ga, In)N layers on the top surface. A device may be fabricated using the film.

The present invention further discloses a method for growing a III-nitride, comprising growing a nonpolar III-nitride film on a miscut of a substrate, wherein the miscut comprises a surface of the substrate angled with a miscut angle with respect to a crystallographic plane of the substrate, in order to increase surface flatness of the nonpolar III-nitride film. The method may further comprise the step of selecting the miscut angle in order to suppress surface undulations of the nonpolar III-nitride film to achieve a smooth surface morphology of the film. The crystallographic plane may be an m-plane, the nonpolar III-nitride film may be m-plane, and the miscut angle may be towards an a-axis direction and comprise a 0.15° or greater miscut angle towards the a-axis direction and a less than 30° miscut angle towards the a-axis direction. A nonpolar III-nitride film may be fabricated using the method.

The present invention further discloses a nonpolar III-nitride-based device comprising a nonpolar III-nitride film, having a smooth surface morphology, grown on a miscut of a substrate.

BRIEF DESCRIPTION OF THE DRAWINGS

Referring now to the drawings in which like reference numbers represent corresponding parts throughout:

FIGS. 2(a), 2(b) and 2(c) are optical micrographs of the surface of an m-plane GaN film grown on a freestanding m-GaN substrate with various miscut angles, wherein FIG. 2(a) shows the surface of an m-plane GaN film grown on a freestanding m-GaN substrate with a miscut angle of 0.01°, FIG. 2(b) shows the surface of an m-plane GaN film grown on a freestanding m-GaN substrate with a miscut angle of 0.15°, and FIG. 2(c) the surface of an m-plane GaN film grown on a freestanding m-GaN substrate with a miscut angle of 0.30°.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

One embodiment of the present invention describes a method of obtaining a smooth surface morphology for nonpolar III-nitride films. Specifically, surface undulations of nonpolar III-nitride films are suppressed by controlling the miscut angle of the substrate upon which the nonpolar III-nitride films are grown.

Current nitride devices are typically grown in the polar [0001] c-direction, which results in charge separation along the primary conduction direction in vertical devices. The resulting polarization fields are detrimental to the performance of current state of the art optoelectronic devices.

Growth of these devices along a nonpolar direction has improved device performance significantly by reducing built-in electric fields along the conduction direction. However, macroscopic surface undulations typically exist on their surfaces, which is harmful to successive film growth.

Until now, no means existed for growing nonpolar III-nitride films without macroscopic surface undulations, even though they provide better device layers, templates, or substrates for device growth. The novel feature of this invention is that nonpolar III-nitride films can be grown as macroscopically and atomically planar films via a miscut substrate.

As evidence of this, the inventors have grown {10-10} planar films of GaN. However, the scope of this invention is not limited solely to these examples; instead, the present invention is relevant to all nonpolar planar films of nitrides, regardless of whether they are homoepitaxial or heteroepitaxial.

Technical Description

The present invention comprises a method of growing planar nonpolar III-nitride films utilizing miscut substrates in the growth process. For example, it is critically important that the substrate has a miscut angle in the proper direction for growth of both macroscopically and atomically planar {10-10} GaN.

In the present invention, a GaN film was grown using a conventional MOCVD method on a freestanding m-GaN substrate with a miscut angle along an a-axis direction. The thickness of the GaN was 5 μm. The surface morphology was investigated by optical microscopy, Atomic Force Microscopy (AFM), and step height measurements.

Figure 1:
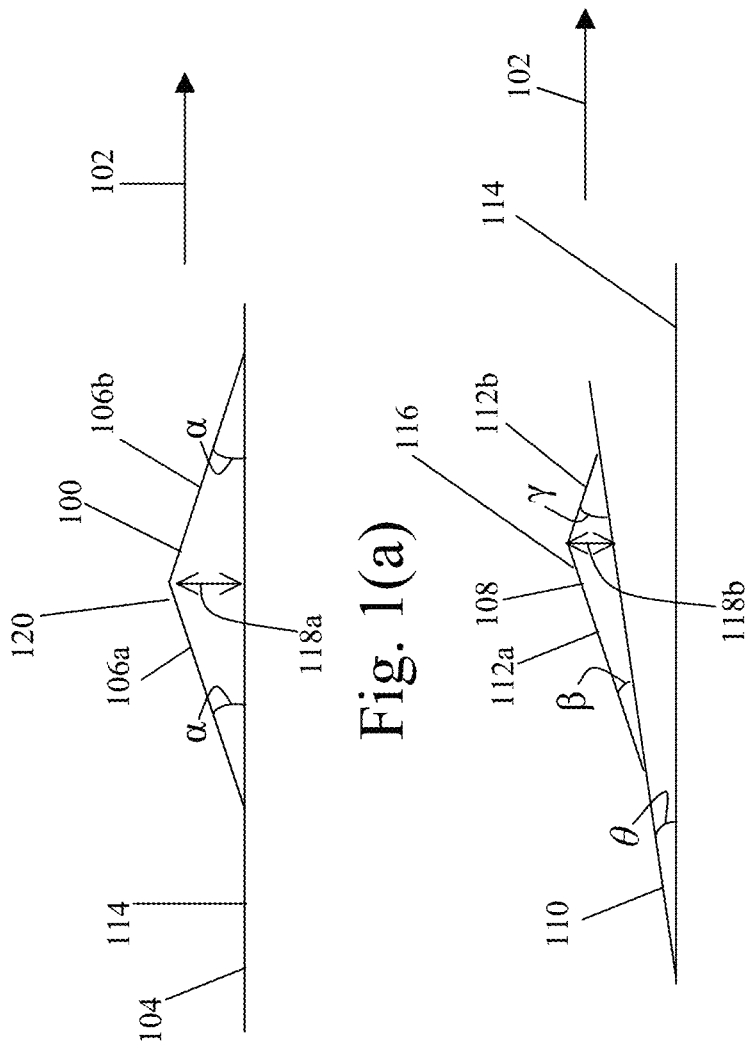
FIGS. 1(a) and 1(b) are schematic drawings of a cross-section of a GaN film along the a-axis direction on a freestanding m-GaN substrate with miscut angles.

FIGS. 1(a) and 1(b) are schematic drawings of the cross-section of the GaN film along the a-axis direction on an m-plane miscut substrate. Specifically, FIG. 1(a) is a schematic drawing of the cross-section of the GaN film 100 along the a-axis direction 102 on the surface 104 of an on-axis m-plane substrate, wherein pyramid facets 106a, 106b of the GaN film 100 form an isosceles triangle with an angle of α on the substrate 104, and FIG. 1(b) is a schematic drawing of the cross-section of the GaN film 108 along the a-axis direction 102 on the surface 110 of a substrate with miscut angle of θ, wherein pyramid facets 112a, 112b of the GaN film 108 with angles of β and γ on the surface 110 of the substrate. The m-plane 114 of the substrates in FIGS. 1(a) and 1(b) is also shown.

The inventors confirmed the same facets independent of the miscut angles from AFM. Therefore, θ is defined by following equations, $$\beta = \alpha - \theta \quad \text{Eq. (1)}$$

$$\gamma = \alpha + \theta \quad \text{Eq. (2)}$$

$$\theta = (\beta - \alpha)/2 \quad \text{Eq. (3)}$$

Experimental Results

Figure 2:
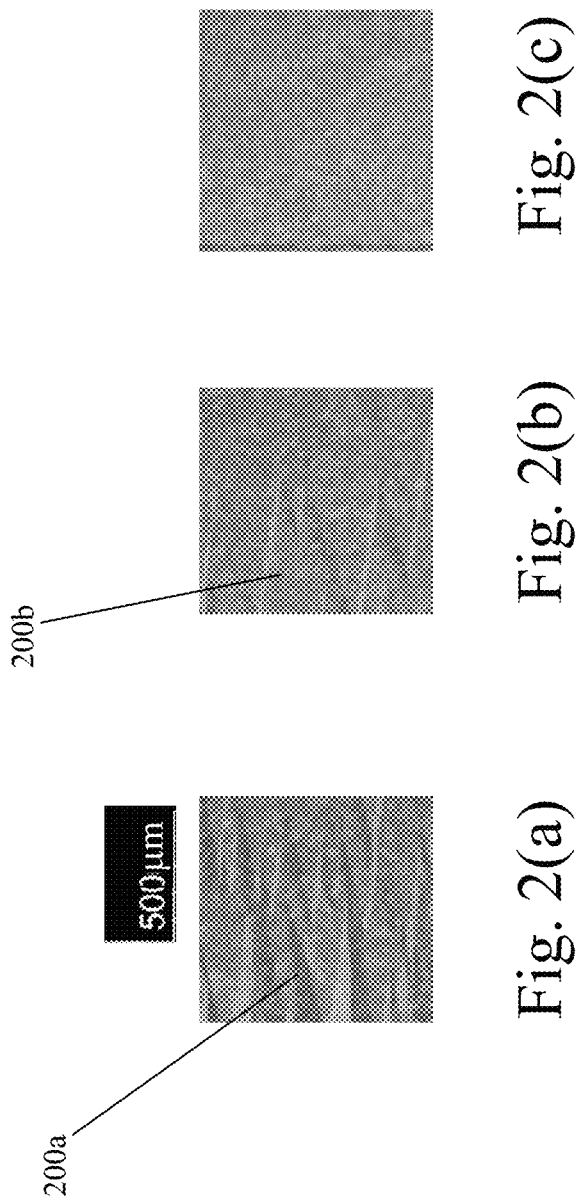

{10-10} GaN films grown on a substrate that is nominally on-axis has been found to have macroscopic surface undulations consisting of four-faceted pyramids. These pyramid facets are typically inclined to the a, $c^+$ and $c^-$ directions, as shown in FIGS. 2(a) and 2(b), wherein FIG. 2(a) has a miscut angle of 0.01° and FIG. 2(b) has a miscut angle of 0.15°. It was found that a smoother surface was obtained by increasing the miscut angle to 0.15°. It was also found that the surface on the substrate with a miscut angle of 0.30° has a smooth morphology, as shown in FIG. 2(c).

Figure 3:
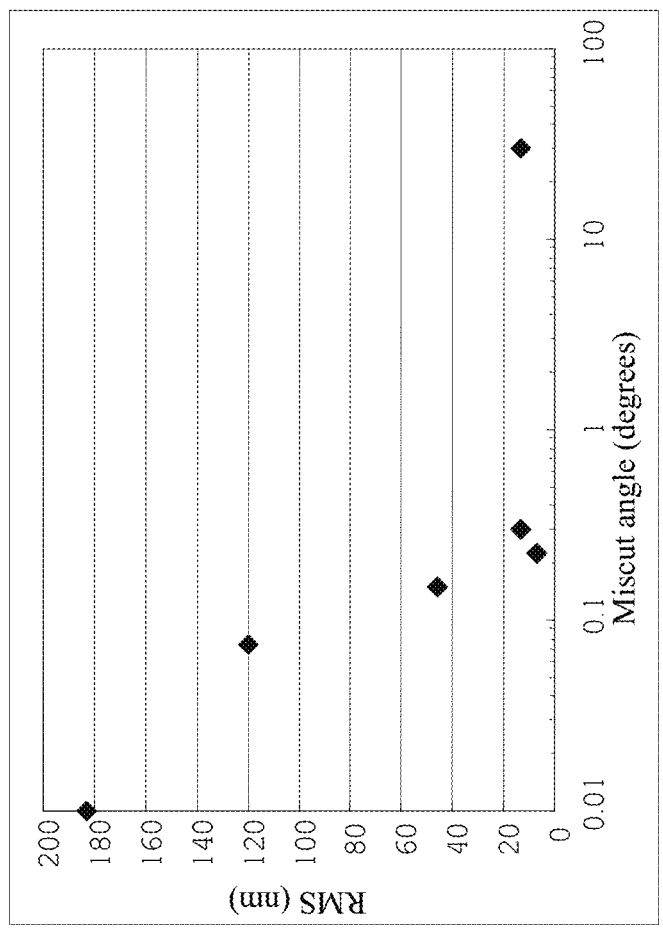
FIG. 3 shows a root mean square (RMS) value evaluated from step height measurements of an m-plane GaN pyramid feature grown on a freestanding m-GaN substrate with various miscut angle variations.

FIG. 3 shows the RMS values evaluated from step height measurements of m-plane GaN pyramid features grown on substrates with various miscut angles. The RMS values over 1000 μm lengths of the films on the each miscut substrate were 183 nm, 121 nm, 47 nm, 7.3 nm, 13 nm, and 13 nm, for mis-orientation angles of 0.01°, 0.075°, 0.15°, 0.225°, 0.30°, and 30°, respectively. The RMS values were found to decrease with increasing miscut angles. In general, an RMS value less than 50 nm is expected for optoelectronic and electronic devices. Thus, it is preferable that the miscut angle of the substrate be 0.15° or greater.

Figure 4:
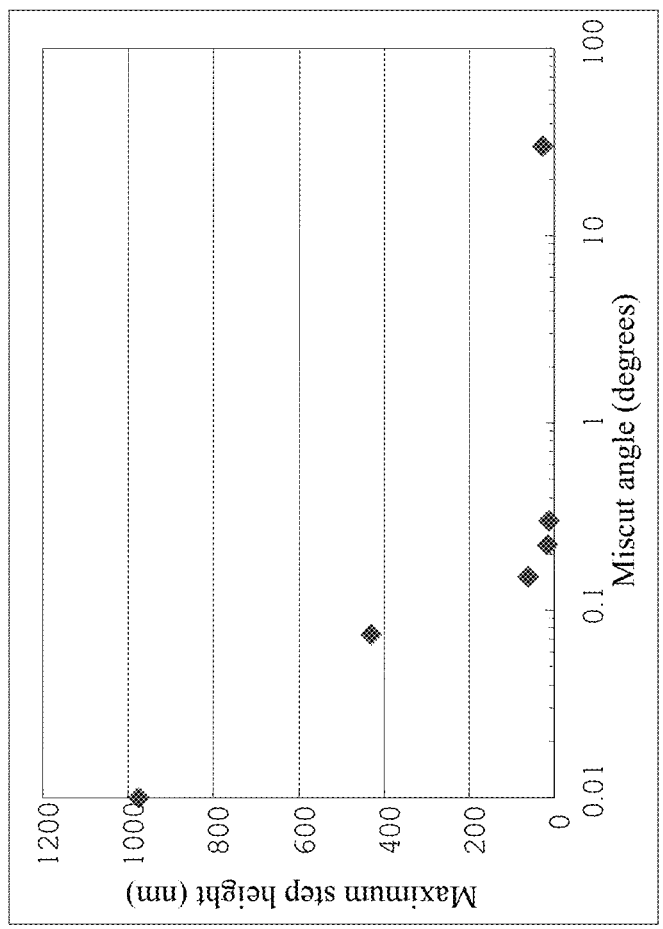
FIG. 4 shows a maximum height value evaluated from step height measurements of an m-plane GaN film grown on a freestanding m-GaN substrate with various miscut angle variations.

FIG. 4 shows the maximum step height values evaluated from step height measurements of m-plane GaN pyramid features grown on substrates with various miscut angles. The maximum step height values over 1000 μm lengths of the films on each miscut substrate were 974 nm, 427 nm, 61 nm, 14 nm, 13 nm, and 25 nm, for mis-orientation angles of 0.01°, 0.075°, 0.15°, 0.225°, 0.30°, and 30°, respectively. The maximum step height values were found to decrease with increasing miscut angles. Judging from FIG. 4, it is preferable that the miscut angle of the substrate be 0.15° or greater.

Process Steps

Figure 5:
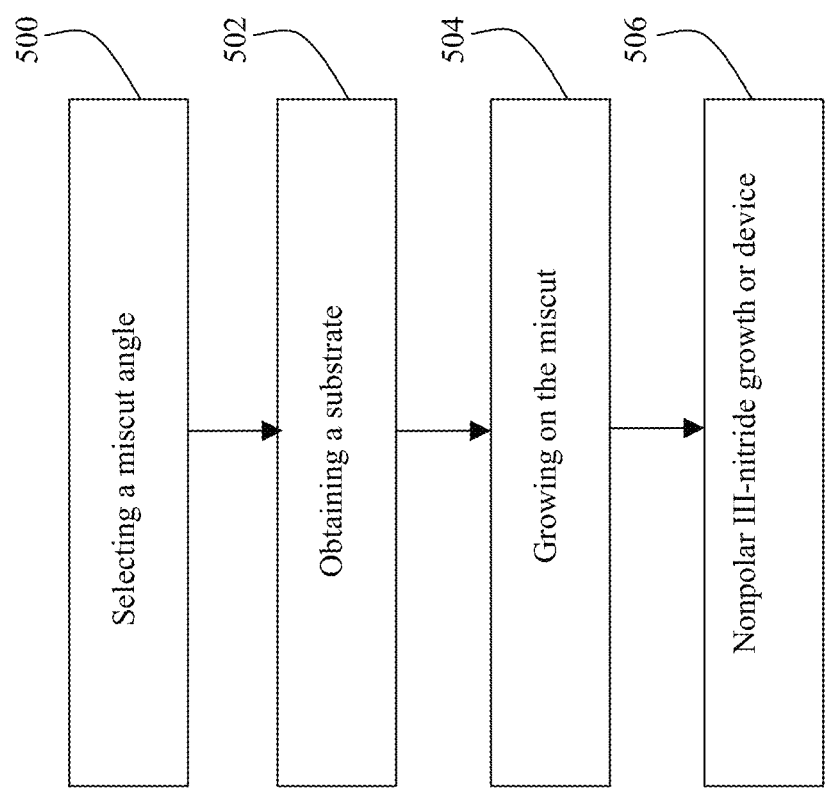
FIG. 5 is a flowchart illustrating a method of the present invention.

FIG. 5 is a flowchart illustrating a method (see also FIG. 1(a) and FIG. 1(b)) for growing III-nitride layers, comprising one or more of the following steps:

Block 500 represents the step of selecting a miscut angle θ in order to suppress surface undulations of the nonpolar III-nitride film.

Block 502 represents the step of obtaining a substrate having a miscut with the desired miscut angle. The miscut may be obtained by slicing the substrate, or selecting a substrate with the desired miscut, for example.

Block 504 represents the step of growing the nonpolar III-nitride layer on the miscut of the substrate, wherein the miscut comprises a surface 110 of the substrate angled with the miscut angle θ with respect to a crystallographic plane 114 of the substrate, in order to increase surface flatness of the nonpolar III-nitride film 108. The crystallographic plane 114 may be an m-plane, the nonpolar III-nitride film 108 may be m-plane, and the miscut angle θ may be towards an a-axis direction and comprise a 0.15° or greater miscut angle towards the a-axis direction and a less than 30° miscut angle towards the a-axis direction.

Block 506 represents a nonpolar III-nitride-based device or film grown using the method, comprising, for example, a nonpolar III-nitride film having a smooth surface morphology, grown on a miscut of a substrate, wherein the surface morphology is smoother than without the miscut.

Figure 6:
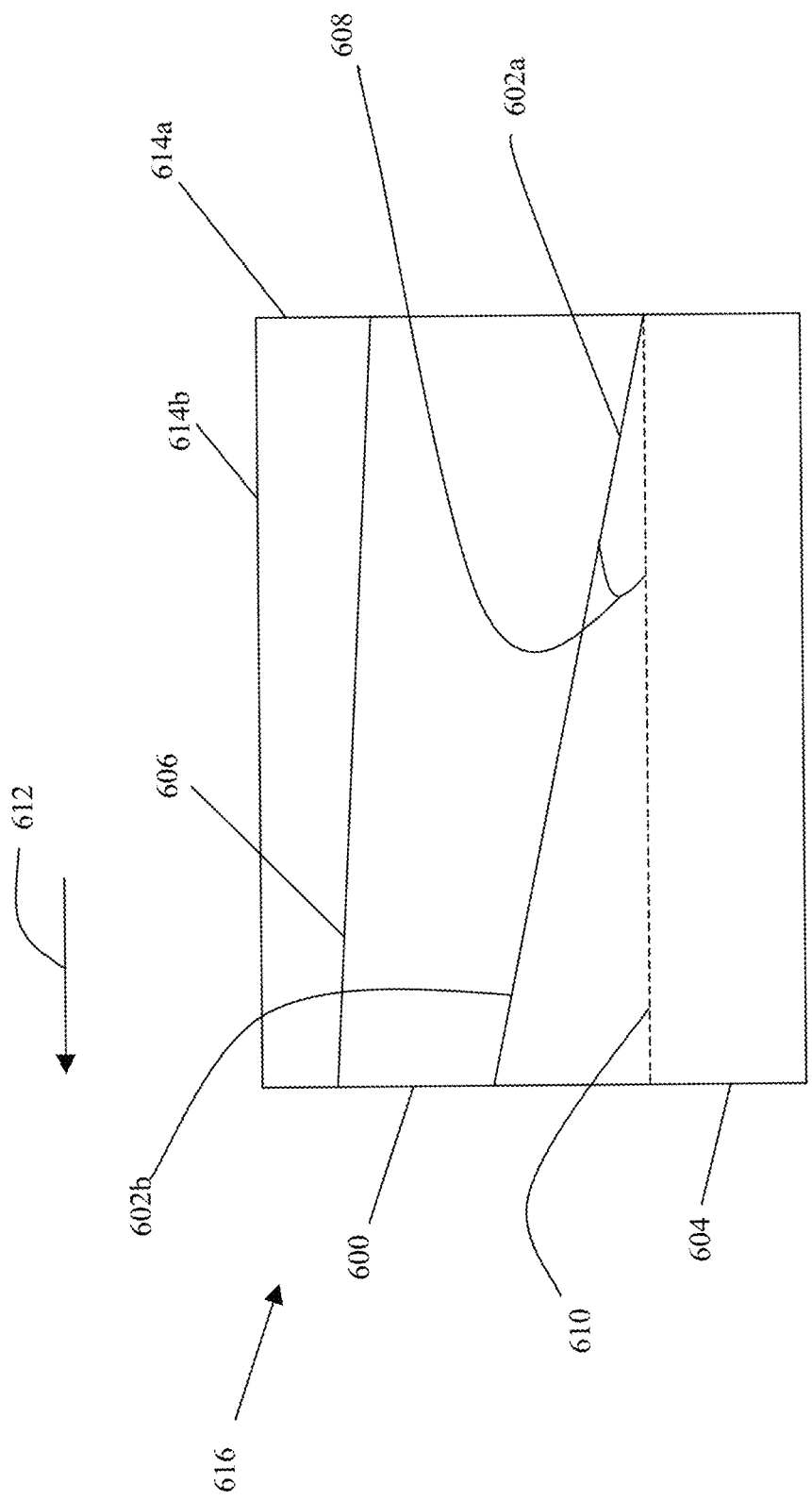
FIG. 6 is a cross sectional schematic of a device according to the present invention.

FIG. 6 is a cross-sectional schematic of a nonpolar III-nitride film 600, e.g. a growth, on a miscut 602a of a substrate 604, wherein a top surface 606 of the film 600 is a nonpolar plane. The miscut 602a may be a surface 602b of the substrate 604 angled at a miscut angle 608 with respect to a crystallographic plane 610 of the substrate 604. The crystallographic plane 610 may be a nonpolar plane. The miscut angle 608 may be from any crystallographic plane 610, e.g. a semipolar plane or c-plane, such that the film 600 is nonpolar or has a nonpolar orientation.

The film 600 may be an m-plane III-nitride nonpolar film such as GaN, the crystallographic plane 610 may be m-plane, and the miscut angle 608 may be towards an a-axis direction 612 and comprise a 0.15° or greater miscut angle 608 towards the a-axis direction 612 and a less than 30° miscut angle 608 towards the a-axis direction 612. However the angular range for the miscut angle greater than 0.15° and less than 30° should also hold true for other nonpolar III-nitride material films 600 (e.g. a-plane or m-plane (Al, B, Ga, In)N compounds) and with miscuts in other nonpolar directions 612 and with respect to other nonpolar crystallographic planes 610. Therefore, the miscut angle 608 may be 0.15° or greater, and less than 30°, with respect to any crystallographic plane 610 or in any direction 612, so long as the miscut angle 608 achieves a nonpolar film 600, for example. For example, the miscut angle 608 may be sufficiently small such that the film 600 is nonpolar.

The film 600, or the top surface 606 of the film 600 may comprise surface undulations (116 in FIG. 1(b)), which may be suppressed by the miscut angle 608 (generally, increasing the miscut angle 608 increases suppression of the undulations 116, or increases smoothness and flatness, or reduces step height 118a of undulations 116). The surface undulations 116 may comprise faceted pyramids. The miscut angle 608 may be such that a root mean square (RMS) step height 118a of the one or more undulations 116 on the top surface 606, over a length of 1000 micrometers, is 50 nm or less. The miscut angle 608 may be such that a maximum step height 118a of the undulations 116 on the top surface 606, over a length of 1000 micrometers is 61 nm or less. The surface undulations 116 may be suppressed by the miscut angle 608 such that a step height 118a of the undulations 116 is less than the step height 118b of undulation(s) 120 without the miscut. The film 600 may comprise a top surface 606 which is atomically smooth, planar, flat, or facetted.

Surface undulations 200a and 200b are also shown in FIGS. 2(a) and 2(b), respectively. In FIG. 2(b), the miscut angle θ is increased so that the surface undulations 200b are suppressed as compared to surface undulations 200a. In FIG. 2(c), the miscut angle θ is increased still further so that the surface undulations are suppressed even further or are non-existent.

The film 600 may further comprise III-nitride 614a deposited on the top surface 606. The miscut angle 608 may be such that the top surface 606, and/or surface(s) 614b of one or more layers 614a grown on the top surface 600, are sufficiently smooth for a quantum well interface (e.g. between a quantum well layer and a barrier layer) or a heterojunction. The film 600 may be a substrate or template, and the top surface 606 may be sufficiently smooth for subsequent growth of device quality (Al, B, Ga, In)N compound layers 614a (e.g. optoelectronic or transistor device layers) on top surface 606.

The film 600 is typically a direct growth rather than a lateral epitaxial overgrowth. The film 600 may be one or more layers having any thickness, i.e. a thick or thin layer. The film 600 may be thick enough to be a bulk crystal or free standing substrate for example.

A device 616, such as laser, light emitting diode, or transistor, may be fabricated using the film 600. For example, the film 600 may comprise device layers. Or device layers 614a may be deposited on the surface of the film 600. The device layers 600, 614a might be p-n junction layers, active layers, quantum well layers, barrier layers, or heterojunction layers, for example. The growth 600 may be removed from the substrate 604 to provide a free standing growth or film.

Possible Modifications and Variations

In addition to the miscut GaN freestanding substrates described above, foreign substrates, such as m-plane SiC, ZnO, and γ-LiAlO2, can be used as a starting material as well.

Although the present invention has been demonstrated using GaN films, AlN, InN or any related alloy can be used as well.

The present invention is not limited to the MOCVD epitaxial growth method described above, but may also use other crystal growth methods, such as HVPE, MBE, etc.

In addition, one skilled in this art would recognize that these techniques, processes, materials, etc., would also apply to miscut angles in other directions, such as the c-axis direction, with similar results.

Advantages and Improvements

On-axis m-plane GaN epitaxial layers always have pyramid shaped features on their surfaces. By controlling the crystal miscut direction and angle, smooth surfaces can be obtained, and thus high quality device structures can achieved.

For example, a laser diode with smooth quantum well interfaces would enhance the device's performance. In another example, a smooth interface for heterostructure epi devices, such as high electron mobility transistors (HEMTs) or heterojunction bipolar transistors (HBTs), would reduce carrier scattering and allow higher mobility of two dimensional electron gas (2 DEG). Overall, this invention would enhance the performance of any device where active layer flatness is crucial to the device performance.

In addition, the enhanced step-flow growth mode via a miscut substrate could suppress defect formation and propagation typically observed in GaN films with a high dopant concentration. Moreover, this would enlarge the growth window of m-GaN, which would result in a better yield during manufacture and would also be useful for any kind of lateral epitaxial overgrowth, selective area growth, and nano structure growths.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for growing a nonpolar III-nitride film, comprising:
   selecting a miscut angle to suppress surface undulations of the nonpolar III-nitride film;
   obtaining a substrate having a miscut with the miscut angle; and
   growing the nonpolar III-nitride film on the miscut of the substrate.

2. The method of claim 1, wherein the nonpolar III-nitride film grown on the miscut of the substrate has a surface morphology that is smoother than a surface morphology of a nonpolar III-nitride film grown on a substrate without the miscut.

3. The method of claim 2, wherein the surface morphology has no macroscopic surface undulations.

4. The method of claim 1, wherein the substrate having the miscut is obtained by slicing the substrate.

5. The method of claim 1, wherein the miscut comprises a surface of the substrate angled with the miscut angle with respect to a crystallographic plane of the substrate.

6. The method of claim 5, wherein the crystallographic plane is an m-plane, the nonpolar III-nitride film is an m-plane, and the miscut angle is towards an a-axis direction.

7. The method of claim 6, wherein the miscut angle comprise a 0.15° or greater miscut angle towards the a-axis direction and a less than 30° miscut angle towards the a-axis direction.

8. The method of claim 1, wherein the miscut angle is such that a root mean square (RMS) step height of the surface undulations, over a length of about 1000 micrometers, is about 50 nm or less.

9. The method of claim 1, wherein a top surface of the nonpolar III-nitride film is a nonpolar plane.

10. The method of claim 1, wherein the nonpolar III-nitride film is sufficiently smooth for subsequent growth of device quality (Al, B, Ga, In)N compound layers.

11. An optoelectronic device, comprising:
    a nonpolar III-nitride film grown on a miscut of a substrate;
    wherein a miscut angle is selected to suppress surface undulations of the nonpolar III-nitride film and the miscut of the substrate has the miscut angle.

12. The device of claim 11, wherein the nonpolar III-nitride film grown on the miscut of the substrate has a surface morphology that is smoother than a surface morphology of a nonpolar III-nitride film grown on a substrate without the miscut.

13. The device of claim 12, wherein the surface morphology has no macroscopic surface undulations.

14. The device of claim 11, wherein the substrate having the miscut is obtained by slicing the substrate.

15. The device of claim 11, wherein the miscut comprises a surface of the substrate angled with the miscut angle with respect to a crystallographic plane of the substrate.

16. The device of claim 15, wherein the crystallographic plane is an m-plane the nonpolar III-nitride film is an m-plane, and the miscut angle is towards an a-axis direction.

17. The device of claim 16, wherein the miscut angle comprise a 0.15° or greater miscut angle towards the a-axis direction and a less than 30° miscut angle towards the a-axis direction.

18. The device of claim 11, wherein the miscut angle is such that a root mean square (RMS) step height of the surface undulations, over a length of about 1000 micrometers, is about 50 nm or less.

19. The device of claim 11, wherein a top surface of the nonpolar III-nitride film is a nonpolar plane.

20. The device of claim 11, wherein the nonpolar III-nitride film is sufficiently smooth for subsequent growth of device quality (Al, B, Ga, In)N compound layers.

\* \* \* \* \*